(12) United States Patent
Lee et al.

(10) Patent No.: US 11,561,397 B2
(45) Date of Patent: Jan. 24, 2023

(54) HEAD-UP DISPLAY DEVICE

(71) Applicants: SAMSUNG ELECTRONICS CO., LTD., Suwon-si (KR); Samjintech Co., Ltd., Yongin-si (KR)

(72) Inventors: Chanhee Lee, Seongnam-si (KR); Young Bae Seo, Yongin-si (KR); Yoonsun Choi, Yongin-si (KR); Jinho Lee, Suwon-si (KR)

(73) Assignees: SAMSUNG ELECTRONICS CO., LTD., Suwon-si (KR); Samjintech Co., Ltd., Yongin-si (KR)

( * ) Notice: Subject to any disclaimer, the term of this patent is extended or adjusted under 35 U.S.C. 154(b) by 30 days.

(21) Appl. No.: 17/134,739

(22) Filed: Dec. 28, 2020

(65) Prior Publication Data

US 2022/0026714 A1   Jan. 27, 2022

(30) Foreign Application Priority Data

Jul. 23, 2020 (KR) .......................... 10-2020-0091809

(51) Int. Cl.
*G02B 27/01* (2006.01)
*H05K 7/20* (2006.01)

(52) U.S. Cl.
CPC .. *G02B 27/0149* (2013.01); *G02B 2027/0169* (2013.01); *H05K 7/20963* (2013.01)

(58) Field of Classification Search
CPC ..................................................... G09B 27/01
See application file for complete search history.

(56) References Cited

U.S. PATENT DOCUMENTS

| 9,423,615 | B2 | 8/2016 | Sato et al. | |
| 2008/0068520 | A1* | 3/2008 | Minikey | G02B 27/01 |
| | | | | 349/114 |
| 2013/0114146 | A1* | 5/2013 | Larson | G02B 27/01 |
| | | | | 359/632 |
| 2014/0022222 | A1* | 1/2014 | Kuo | G02B 26/08 |
| | | | | 345/205 |
| 2014/0293239 | A1 | 10/2014 | Shimizu et al. | |
| 2017/0123245 | A1* | 5/2017 | Iwai | G02F 1/1339 |
| 2019/0182994 | A1 | 6/2019 | O'Connell et al. | |
| 2019/0219872 | A1* | 7/2019 | Shi | G02B 1/005 |
| 2019/0250461 | A1 | 8/2019 | Andreev et al. | |
| 2019/0339196 | A1* | 11/2019 | Abel | C12M 41/14 |
| 2020/0004067 | A1 | 1/2020 | Hada et al. | |

FOREIGN PATENT DOCUMENTS

| JP | 2015004709 A | 1/2015 |
| JP | 2015087590 A | 5/2015 |
| JP | 2018087775 A | 6/2018 |
| JP | 6437127 B2 | 12/2018 |

(Continued)

*Primary Examiner* — Roy P Rabindranath
(74) *Attorney, Agent, or Firm* — Sughrue Mion, PLLC

(57) ABSTRACT

A head-up display (HUD) device includes a plurality of backlight units (BLUs); a base including a base plate and a base body, the base plate being configured to support the plurality of BLUs, and the base body protruding upward from the base plate; a head detachably connected to the base; a sheet of glass disposed on an upper side of the head; and a thin film transistor disposed on a top surface of the sheet of glass, wherein the head includes a material with a higher thermal conductivity than the base.

18 Claims, 5 Drawing Sheets

(56) References Cited

FOREIGN PATENT DOCUMENTS

| | | | |
|---|---|---|---|
| JP | 2019071660 | A | 5/2019 |
| JP | 6602543 | B2 | 11/2019 |
| JP | 2020055413 | A | 4/2020 |
| KR | 20160090701 | * | 1/2016 |
| KR | 10-2016-0090701 | A | 8/2016 |
| WO | 2020050044 | A1 | 3/2020 |

* cited by examiner

HEAD-UP DISPLAY DEVICE

CROSS-REFERENCE TO RELATED APPLICATION

This application claims priority from Korean Patent Application No. 10-2020-0091809, filed on Jul. 23, 2020, in the Korean Intellectual Property Office, the disclosure of which is herein incorporated by reference in its entirety.

BACKGROUND

1. Field

Example embodiments of the disclosure relate to a head-up display (HUD) device.

2. Description of the Related Art

A head-up display (HUD) device displays, on a front windshield inside a vehicle such as a car or an airplane, various information on the vehicle, for example, a current speed, a time, a set route, an outdoor temperature, a humidity, or a fuel level. The HUD device may assist a user to check various information of the vehicle while gazing at the front.

The HUD device generates graphics through a thin film transistor. The HUD device provides information to the user by projecting the generated graphics onto glass by using a mirror or the like.

Recently, there is a trend to make a large screen to be implemented through a HUD device. To form a large screen, graphics need to be projected from the thin film transistor at a greater angle. However, when the angle at which graphics are projected increases, the sunload entering the thin film transistor inversely through the glass may increase. As a result, the sunload and backlight units (BLUs) may cause thermal damage to the surface of the thin film transistor.

To prevent thermal damage to the surface of the thin film transistor, there is a need for a technology for externally discharging heat transferred to the thin film transistor by the sunload and blocking heat transferred from the BLUs to the thin film transistor.

The above description has been possessed or acquired by the inventor(s) in the course of conceiving the disclosure and is not necessarily an art publicly known before the effective filing date of the present application.

SUMMARY

One or more example embodiments may address at least the above problems and/or disadvantages and other disadvantages not described above. Also, the example embodiments are not required to overcome the disadvantages described above, and an example embodiment may not overcome any of the problems described above.

According to an aspect of an example embodiment, there is provided a head-up display (HUD) device including a plurality of backlight units (BLUs), a base including a base plate and a base body, the base plate being configured to support the plurality of BLUs, and the base body protruding upward from the base plate; a head detachably connected to the base; a sheet of glass disposed on an upper side of the head; and a thin film transistor disposed on a top surface of the sheet of glass, wherein the head includes a material with a higher thermal conductivity than the base.

The head may include at least one of copper, aluminum, carbon fiber, carbon nanotube, or polyethylene.

The base may include at least one of polypropylene, polystyrene, or polyisoprene.

The head may include: a head body detachably connected to the base body; and a head protrusion that protrudes upward from the head body and surrounds the thin film transistor and the sheet of glass.

A bottom surface of the sheet of glass may be in surface contact with the head body, and a side surface of the sheet of glass is in surface contact with the head protrusion.

The head body may include a lateral extending part that is in surface contact with a bottom surface of the sheet of glass.

The head body may include a downward extending part that is in surface contact with an outer surface of the base body.

The HUD device may further include a damper provided between the head protrusion and the thin film transistor.

The damper may be configured to absorb heat of the thin film transistor to perform a phase change.

A contact area between the sheet of glass and the head may be greater than a contact area between the head and the base.

The HUD device may further include a clamp detachably provided on a top surface of the head and configured to fasten the thin film transistor to the head.

The HUD device may further include a fastener configured to fasten the base and the head.

The sheet of glass may be thicker than the thin film transistor.

The base and the head may respectively include a plurality of cooling fins.

The HUD device may further include a film configured to support at least a portion of the sheet of glass on which the thin film transistor is disposed.

The film may include at least one of a heat-storing material or a heat-dissipating material.

The head may further include a clamp fixing protrusion that protrudes from at least one of an outer surface of the head body or an outer surface of the head protrusion.

The HUD device may further include a clamp, the clamp including a clamp body configured to fasten edge portions of the thin film transistor, and a clamp arm configured to extend from the clamp body to be caught by the clamp fixing protrusion.

According to an aspect of an example embodiment, there is provided a head-up display (HUD) device, including: a base configured to accommodate a plurality of backlight units (BLUs); a head detachably connected to the base; and a thin film transistor disposed on an upper side of the head, wherein the head includes a material with a higher thermal conductivity than the base.

BRIEF DESCRIPTION OF THE DRAWINGS

The above and/or other aspects will be more apparent by describing certain example embodiments with reference to the accompanying drawings, in which.

DETAILED DESCRIPTION

Figure 1:
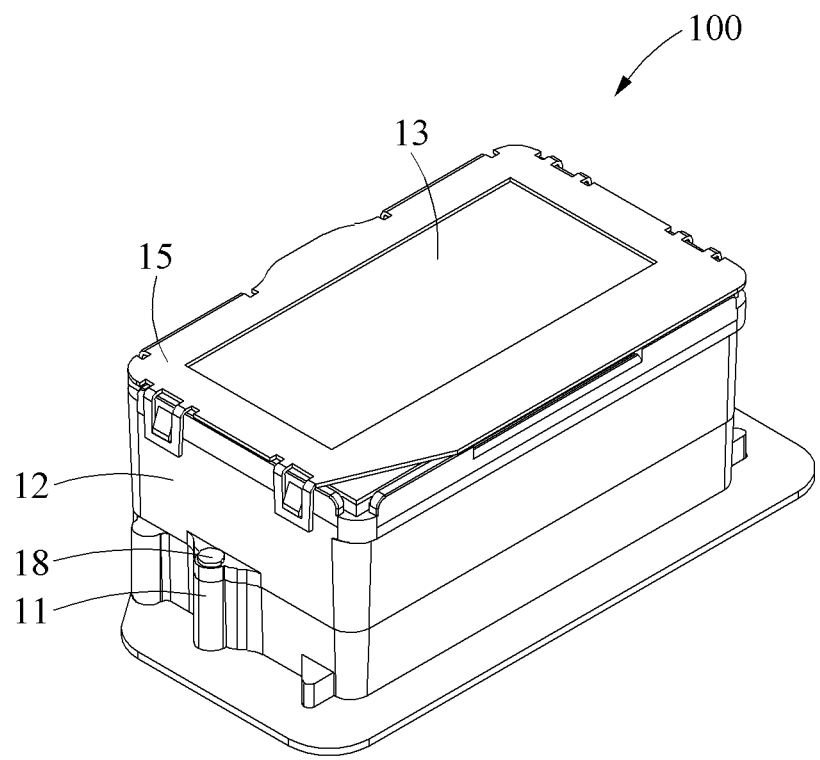
FIG. 1 is a perspective view illustrating a head-up display (HUD) device according to an example embodiment.

Hereinafter, example embodiments of the disclosure will be described with reference to the accompanying drawings. Regarding the reference numerals assigned to the components in the drawings, it should be noted that the same components will be designated by the same reference numerals, wherever possible, even though they are shown in different drawings. Also, in the description of the example embodiments, detailed description of well-known related structures or functions will be omitted when it is deemed that such description will cause ambiguous interpretation of the disclosure.

Also, in the description of the components, terms such as first, second, A, B, (a), (b) or the like may be used herein when describing components of the disclosure. These terms are used only for the purpose of discriminating one constituent element from another constituent element, and the nature, the sequences, or the orders of the constituent elements are not limited by the terms. When one constituent element is described as being "connected", "coupled", or "attached" to another constituent element, it should be understood that one constituent element may be connected or attached directly to another constituent element, and an intervening constituent element may also be "connected", "coupled", or "attached" to the constituent elements.

The same name may be used to describe an element having a common function and included in example embodiments. Unless otherwise mentioned, the descriptions on the example embodiments may be applicable to the following example embodiments and thus, duplicated descriptions will be omitted for conciseness.

Figure 2:
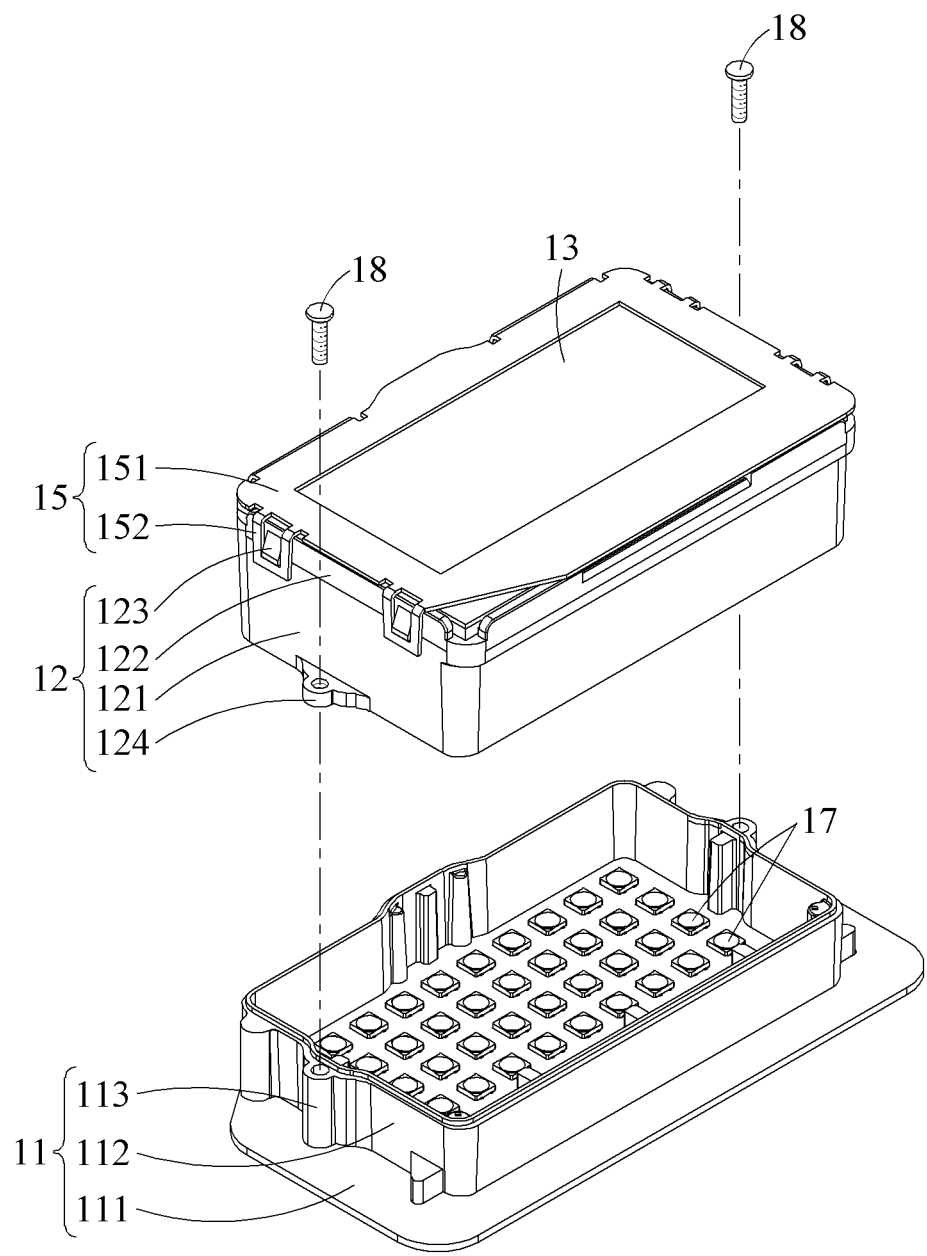
FIG. 2 is an exploded perspective view illustrating a HUD device according to an example embodiment.
Figure 3:
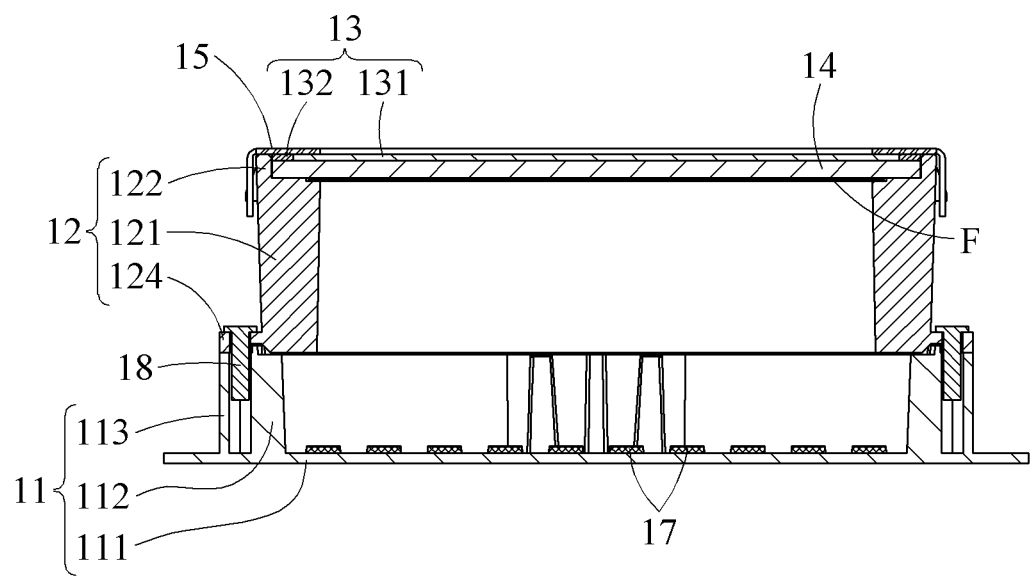
FIG. 3 is a cross-sectional view illustrating a HUD device according to an example embodiment.

FIG. 1 is a perspective view illustrating a head-up display (HUD) device according to an example embodiment, FIG. 2 is an exploded perspective view illustrating a HUD device according to an example embodiment, and FIG. 3 is a cross-sectional view illustrating a HUD device according to an example embodiment.

Referring to FIGS. 1 to 3, a HUD device 100 has an effective heat dissipation structure to prevent the deformation of a thin film transistor by heat. The HUD device 100 may include a base 11, a head 12, a thin film transistor 13, a sheet of glass 14, a film F, a clamp 15, a plurality of backlight units (BLUs) 17, and a fastener 18.

The base 11 may accommodate the plurality of BLUs 17. The base 11 may include a base plate 111 configured to support the plurality of BLUs 17, a base body 112 formed to protrude upward from the base plate 111, and a base connection part 113. The base 11 may include a material that does not easily transfer heat. In other words, the base 11 may include a material with a relatively low thermal conductivity. For example, the base 11 may include at least one of polypropylene, polystyrene, or polyisoprene.

The head 12 may be detachably connected to the base 11. The head 12 may be detached from the base 11 or attached to the base 11. The head 12 may include a material that may easily transfer heat. In other words, the head 12 may include a material with a relatively high thermal conductivity. For example, the head 12 may include at least one of copper, aluminum, carbon fiber, carbon nanotube, or polyethylene.

This structure may prevent the heat of the base 11 from being easily transferred to the head 12. In detail, the base 11 and the head 12 may include different materials, and the base 11 may include a material with a relatively low thermal conductivity. Thus, even if the base 11 is heated by the plurality of BLUs 17 such that the base 11 reaches a temperature higher than the temperature of the head 12, the heat of the base 11 may not be easily transferred to the head 12. Consequently, an amount of heat of the base 11 that may be transferred to the thin film transistor 13 through the head 12 is limited.

The head 12 may include a head body 121 detachably connected to the base body 112, a head protrusion 122 formed to protrude upward from the head body 121, a clamp fixing protrusion 123 formed to protrude from an outer surface of the head body 121 and/or the head protrusion 122, and a head connection part 124. The head protrusion 122 may surround the thin film transistor 13 and the glass 14. The clamp fixing protrusion 123 may have a structure by which the clamp 15 is caught. The head connection part 124 may be aligned to face the base connection part 113.

The thin film transistor 13 may be disposed on a top surface of the glass 14. The thin film transistor 13 may generate graphics by receiving light from the plurality of BLUs 17. The thin film transistor 13 may include an active region 131 and an inactive region 132.

The glass 14 may be disposed on an upper side of the head 12. For example, edges of the glass 14 may be disposed on the upper side of the head 12. The glass 14 may support the thin film transistor 13. The glass 14 may absorb heat of the thin film transistor 13 to prevent the thin film transistor 13 from being deformed by heat. The glass 14 may be thicker than the thin film transistor 13 and thus, have a relatively great heat capacity.

A bottom surface of the glass 14 may be in surface contact with the head body 121, a side surface of the glass 14 may be in surface contact with the head protrusion 122. This structure may allow effective heat transfer between the glass 14 and the head 12. The heat of the thin film transistor 13 may be transferred to the head 12 through the glass 14, and the heat transferred to the head 12 may dissipate to the outside of the HUD device 100. For example, portions of the glass 14 coupled to the thin film transistor 13 may be supported by the film F. The film F may alleviate an impact applied to the thin film transistor 13. For example, the film F may include a heat-storing and/or heat-dissipating material.

A contact area between the glass 14 and the head 12 may be greater than a contact area between the head 12 and the base 11. This structure may allow heat transfer between the glass 14 and the head 12 to be effectively performed when compared to the heat transfer between the head 12 and the base 11.

The clamp 15 may be detachably provided on a top surface of the head 12 and configured to fasten the thin film transistor 13 to the head 12. The clamp 15 may include a clamp body 151 configured to fasten edge portions of the thin film transistor 13 while being in contact with the edge portions of the thin film transistor 13, and a clamp arm 152 configured to extend from the clamp body 151 to be caught by the clamp fixing protrusion 123.

The plurality of BLUs 17 may be disposed on the base plate 111 and irradiate light to the thin film transistor 13.

The fastener 18 may fasten the base 11 and the head 12. For example, the fastener 18 may be a screw to be coupled to the base 11 and the head 12. While it is illustrated in the drawings that the fastener 18 is a screw to be coupled to the base connection part 113 and the head connection part 124, example embodiments are not limited thereto. For example, the fastener 18 may be a clamp or a band or any suitable component configured to fasten the base 11 and the head 12.

The fastener 18 may include, for example, a material with a lower thermal conductivity than the head 12.

Heat generated by the plurality of BLUs 17 may be transferred to the head 12 through the base 11. By forming the base 11 and the head 12 as separate components rather than as an integral body, the HUD device 100 may reduce the heat transfer from the base 11 to the head 12. As described above, in the HUD device 100, the head 12 may include a material with a relatively high thermal conductivity, and the base 11 may include a material with a relatively low thermal conductivity. Accordingly, the HUD device 100 may allow the heat of the thin film transistor 13 to be transferred through the head 12 and well dissipate to the outside, thereby reducing the transfer of heat generated by the plurality of BLUs 17 to the thin film transistor 13.

Figure 4:
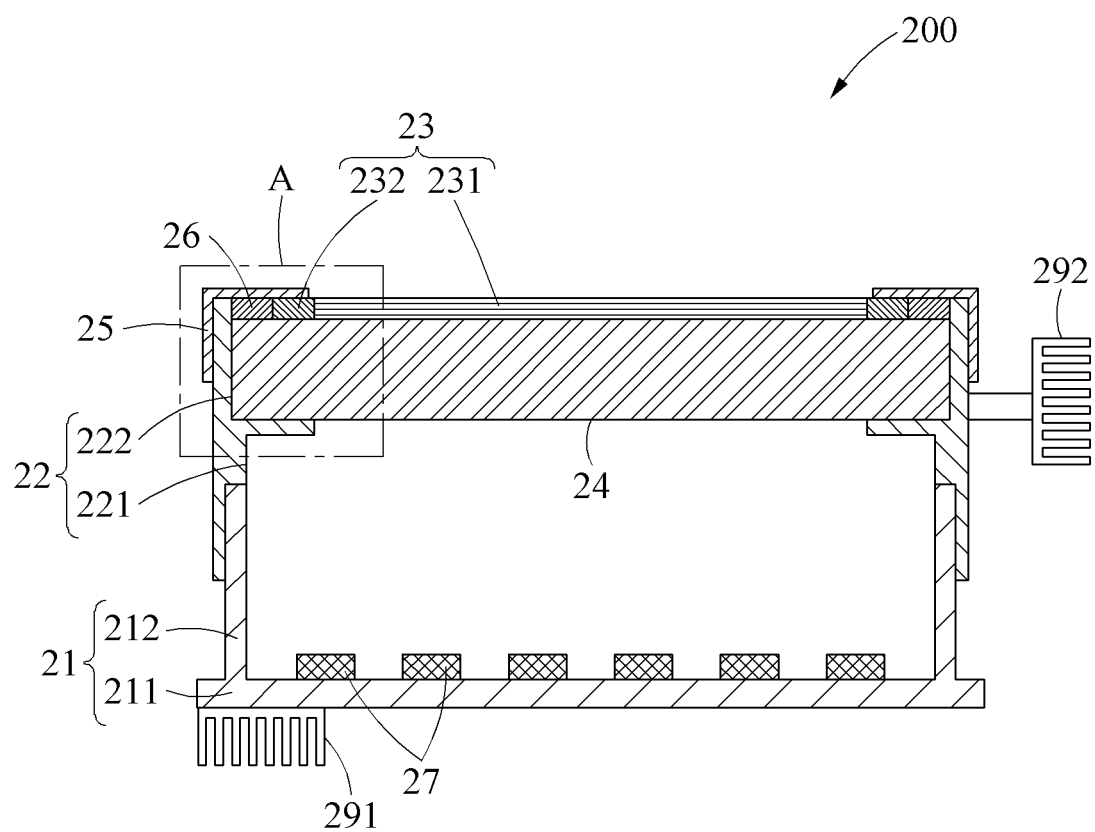
FIG. 4 is a cross-sectional view illustrating a HUD device according to another example embodiment.
Figure 5:
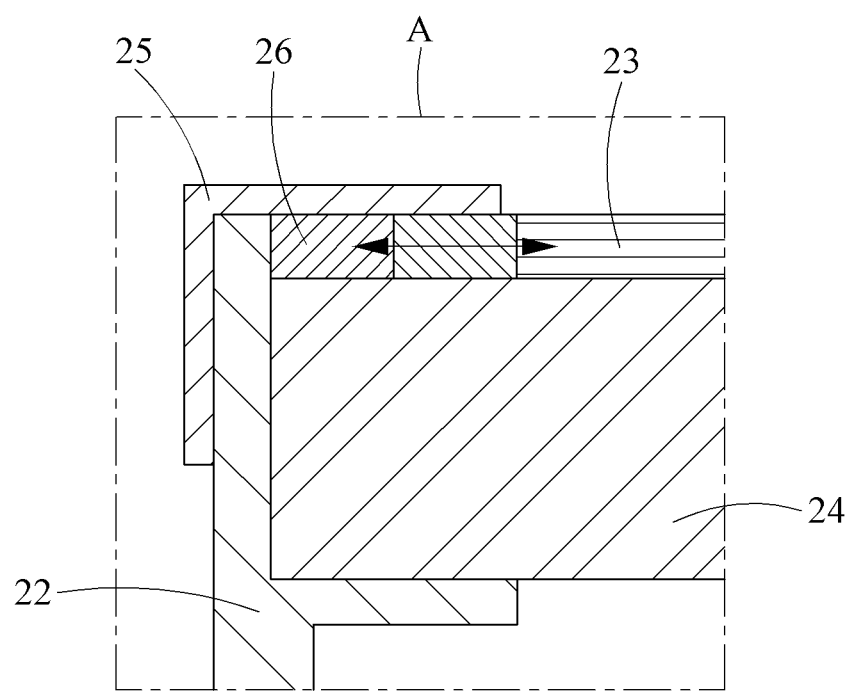
FIG. 5 is a cross-sectional view magnifying a portion A of FIG. 4.

FIG. 4 is a cross-sectional view illustrating a HUD device according to another example embodiment, and FIG. 5 is a cross-sectional view magnifying a portion A of FIG. 4.

Referring to FIGS. 4 and 5, a HUD device 200 may include a base 21, a head 22, a thin film transistor 23, a sheet of glass 24, a clamp 25, and a plurality of BLUs 27, base cooling fins 291, and head cooling fins 292.

The base 21 may include a base plate 211 configured to support the plurality of BLUs 27, and a base body 212 formed to protrude upward from the base plate 211.

The head 22 may include a head body 221 coupled to the base body 212, and a head protrusion 222 formed to protrude upward from the head body 221. The head body 221 may include a downward extending part that is in surface contact with an outer surface of the base body 212. The downward extending part of the head body 221 may increase a surface area of the head 22 exposed to an outdoor air, thereby assisting heat to effectively dissipate from the head 22 to the outside. The head body 221 may include a lateral extending part that is in surface contact with a bottom surface of the glass 24. The lateral extending part of the head body 221 may increase a contact area between the head 22 and the glass 24, thereby assisting with effective heat transfer between the glass 24 and the head 22.

The thin film transistor 23 may include an active region 231 and an inactive region 232. The thin film transistor 23 may be fastened by the clamp 25. The thin film transistor 23 may be supported by the glass 24 that is relatively thick.

A damper 26 may be provided between the head protrusion 222 and the inactive region 232 of the thin film transistor 23. The damper 26 may prevent damage to the thin film transistor 23 by partly allowing the thin film transistor 23 to be shaken laterally (see the arrow in FIG. 5) by an external impact.

The damper 26 may absorb heat of the thin film transistor 23 to undergo a phase change. For example, the damper 26 may include a phase change material. Heat generated by the thin film transistor 23 may be transferred laterally to the damper 26 and transferred downward to the glass 24.

The base cooling fins 291 and the head cooling fins 292 may be provided on the base 21 and the head 22, respectively, to assist with heat transfer from the base 21 and the head 22 to the outside.

A number of example embodiments have been described above. Nevertheless, it should be understood that various variations, modifications, or replacements may be made to these example embodiments. For example, suitable results may be achieved if the described techniques are performed in a different order and/or if components in a described system, architecture, device, or circuit are combined in a different manner and/or replaced or supplemented by other components or their equivalents. Such variations, modifications, or replacements would fall within the spirit and scope of the appended claims.

What is claimed is:

1. A head-up display (HUD) device, comprising:
   a plurality of backlight units (BLUs);
   a base comprising a base plate and a base body, the base plate being configured to support the plurality of BLUs, and the base body protruding upward from the base plate;
   a head comprising a head body detachably connected to the base body;
   a sheet of glass disposed on an upper side of the head; and
   a thin film transistor disposed on a top surface of the sheet of glass,
   wherein the head includes a material with a higher thermal conductivity than the base, and
   wherein the head further comprises a head protrusion that protrudes upward from the head body and surrounds the thin film transistor and the sheet of glass.

2. The HUD device of claim 1, wherein the head includes at least one of copper, aluminum, carbon fiber, carbon nanotube, and polyethylene.

3. The HUD device of claim 1, wherein the base includes at least one of polypropylene, polystyrene, and polyisoprene.

4. The HUD device of claim 1, wherein a bottom surface of the sheet of glass is in surface contact with the head body, and a side surface of the sheet of glass is in surface contact with the head protrusion.

5. The HUD device of claim 1, wherein the head body comprises a lateral extending part that is in surface contact with a bottom surface of the sheet of glass.

6. The HUD device of claim 1, wherein the head body comprises a downward extending part that is in surface contact with an outer surface of the base body.

7. The HUD device of claim 1, further comprising:
   a damper provided between the head protrusion and the thin film transistor.

8. The HUD device of claim 7, wherein the damper is configured to absorb heat of the thin film transistor to perform a phase change.

9. The HUD device of claim 1, wherein a contact area between the sheet of glass and the head is greater than a contact area between the head and the base.

10. The HUD device of claim 1, further comprising:
    a clamp detachably provided on a top surface of the head and configured to fasten the thin film transistor to the head.

11. The HUD device of claim 1, further comprising:
    a fastener configured to fasten the base and the head.

12. The HUD device of claim 1, wherein the sheet of glass is thicker than the thin film transistor.

13. A head-up display (HUD) device, comprising:
    a plurality of backlight units (BLUs),
    a base comprising a base plate and a base body, the base plate being configured to support the plurality of BLUs, and the base body protruding upward from the base plate;
    a head detachably connected to the base;
    a sheet of glass disposed on an upper side of the head; and
    a thin film transistor disposed on a top surface of the sheet of glass,
    wherein the head includes a material with a higher thermal conductivity than the base, and
    wherein the base and the head respectively comprise a plurality of cooling fins.

14. The HUD device of claim 1, further comprising a film configured to support at least a portion of the sheet of glass on which the thin film transistor is disposed.

15. The HUD device of claim 14, wherein the film comprises at least one of a heat-storing material or a heat-dissipating material.

16. The HUD device of claim 13, wherein the head further comprises a clamp fixing protrusion that protrudes from at least one of an outer surface of the head body or an outer surface of the head protrusion.

17. The HUD device of claim 16, further comprising a clamp, the clamp comprising a clamp body configured to fasten edge portions of the thin film transistor, and a clamp arm configured to extend from the clamp body to be caught by the clamp fixing protrusion.

18. A head-up display (HUD) device, comprising:
- a base configured to accommodate a plurality of backlight units (BLUs);
- a head comprising a head body detachably connected to the base; and
- a thin film transistor disposed on an upper side of the head,
- wherein the head includes a material with a higher thermal conductivity than the base, and
- wherein the head further comprises a head protrusion that protrudes upward from the head body and surrounds the thin film transistor.

\* \* \* \* \*